(12) United States Patent
Chang

(10) Patent No.: US 6,696,756 B2
(45) Date of Patent: *Feb. 24, 2004

(54) GOLD WIRE FOR USE IN SEMICONDUCTOR PACKAGING AND HIGH-FREQUENCY SIGNAL TRANSMISSION

(76) Inventor: Tao-Kuang Chang, 8F., 28, Lane 490, Hsin Tai Road, Hsinchuang, Taipei Hsien (TW)

(*) Notice: Subject to any disclaimer, the term of this patent is extended or adjusted under 35 U.S.C. 154(b) by 0 days.

This patent is subject to a terminal disclaimer.

(21) Appl. No.: 10/119,019

(22) Filed: Apr. 10, 2002

(65) Prior Publication Data

US 2003/0013288 A1 Jan. 16, 2003

Related U.S. Application Data

(62) Division of application No. 09/904,855, filed on Jul. 16, 2001, now abandoned.

(51) Int. Cl.[7] ............................................. H01L 21/302
(52) U.S. Cl. ...................... 257/734; 257/784; 174/126.2
(58) Field of Search .................................. 438/650, 686, 438/617; 257/734, 762, 784; 174/126.2; 29/825

(56) References Cited

U.S. PATENT DOCUMENTS

| | | | |
|---|---|---|---|
| 4,859,811 A | * | 8/1989 | Sawada et al. ............ 174/126.2 |
| 6,261,436 B1 | * | 7/2001 | Chang ........................ 205/206 |
| 6,302,732 B1 | * | 10/2001 | Budman et al. ............. 439/581 |

* cited by examiner

Primary Examiner—Tuan H. Nguyen
(74) Attorney, Agent, or Firm—Troxell Law Office PLLC

(57) ABSTRACT

A gold wire having a non-pure gold core member and a layer of pure gold coating covering the non-pure gold core member. The fabrication method of the gold wire includes the procedures of (1) selecting a non-pure gold wire rod, (2) gold-plating the non-pure gold wire rod with a layer of pure gold coating of thickness about 10~100 $\mu$in, (3) drawing the pure gold-coated wire rod into a gold wire of thickness about 40~4000 $\mu$in, (4) examining the material properties of the gold wire so as to obtained the desired finished product.

2 Claims, 2 Drawing Sheets

GOLD WIRE FOR USE IN SEMICONDUCTOR PACKAGING AND HIGH-FREQUENCY SIGNAL TRANSMISSION

RELATED APPLICATION

This is a Divisional application of U.S. Ser. No. 09/904,855, filed Jul. 16, 2001, entitled GOLD WIRE FOR USE IN SEMICONDUCTOR PACKAGING AND HIGH-FREQUENCY SIGNAL TRANSMISSION AND ITS FABRICATION METHOD, now abandoned.

BACKGROUND OF THE INVENTION

The present invention relates to gold wires for use in semiconductor packaging and high-frequency signal transmission. A gold wire according to the present invention comprises a non-pure gold core member obtained from oxygen free copper, pure silver, or pure palladium, and a layer of pure gold coating covering the non-pure gold core member. The invention relates also to the fabrication of the gold wire.

The gold wires for use in semiconductor packaging are commonly fabricated from pure gold. Because pure gold is expensive, the manufacturing cost of gold wires for this purpose is high.

SUMMARY OF THE INVENTION

The present invention has been accomplished under the circumstances in view. It is one object of the present invention to provide a gold wire, which is suitable for use in semiconductor packaging and high-frequency signal transmission. It is another object of the present invention to provide a gold wire for semiconductor packaging and high-frequency signal transmission, which is inexpensive to manufacture. According to one aspect of the present invention, the gold wire comprises a non-pure gold core member obtained from oxygen free copper, pure silver, or pure palladium, and a layer of pure gold coating covering the non-pure gold core member. According to another aspect of the present invention, the gold wire fabrication method includes the procedures of (1) selecting a non-pure gold wire rod, (2) gold-plating the non-pure gold wire rod with a layer of pure gold coating of thickness about 10~100 μin, (3) drawing the pure gold-coated wire rod into a cold wire of thickness about 40~4000 μin, (4) examining the material properties of the gold wire so as to obtained the desired finished product.

DETAILED DESCRIPTION OF THE PREFERRED EMBODIMENT

Figure 1:
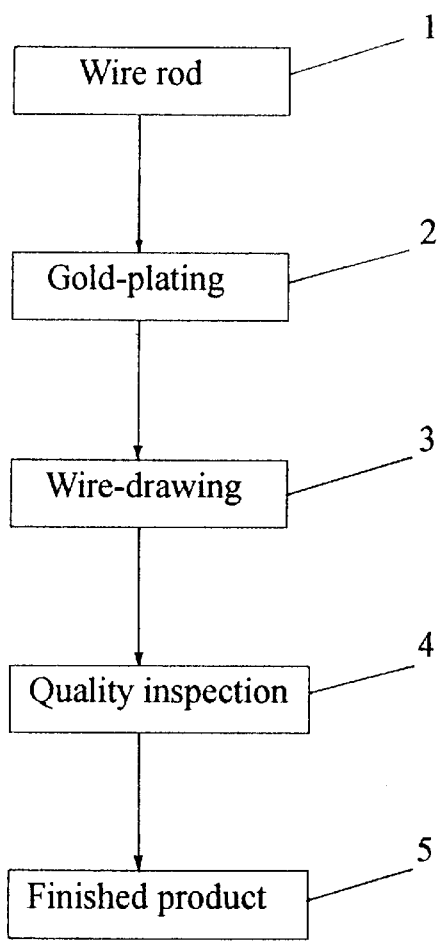
FIG. 1 is a block diagram explaining the fabrication flow of the present invention.

Referring to FIG. 1, a gold wire fabrication method in accordance with the present invention comprises the procedures of:

(1) material preparation where a wire rod is obtained from a non-pure gold material;

(2) gold-plating: where the prepared wire rod is coated with a layer of gold coating;

(3) wire-drawing: where the gold-plated wire rod is drawn into a gold-plated wire subject to the desired thickness;

(4) quality inspection: where the gold-plated wire is inspected through a series material property examinations;

(5) finished product.

Figure 2:
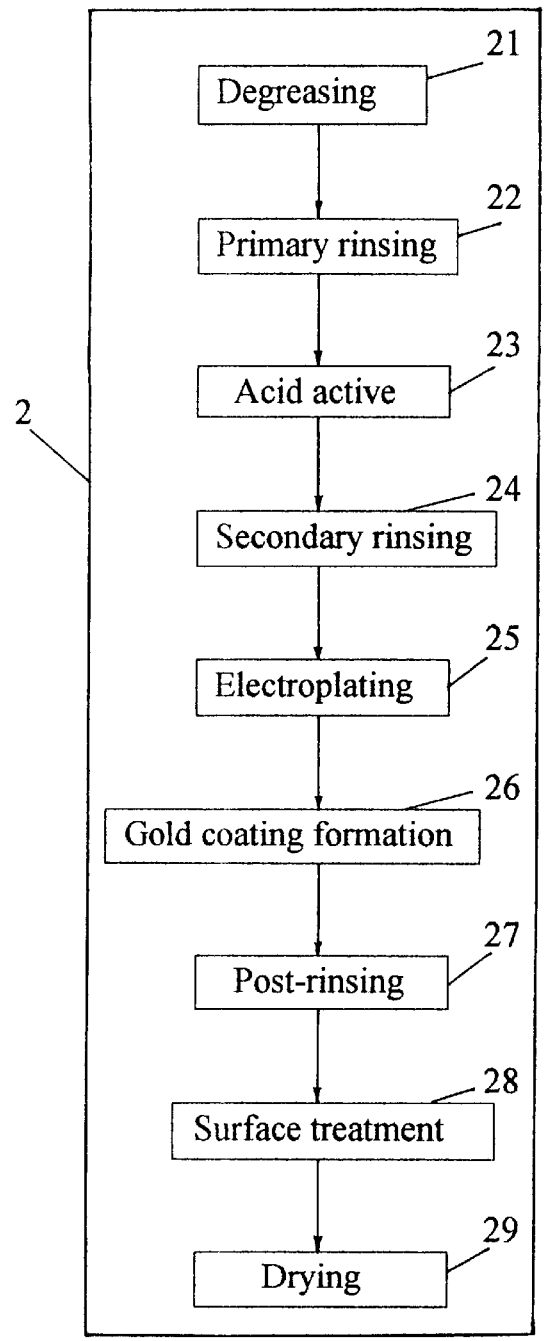
FIG. 2 is a block diagram explaining the flow of the gold-plating procedure.

Referring to FIG. 2, the aforesaid gold-plating procedure 2 is to coat the selected wire rod with a layer of pure gold coating, so as to improve the corrosion-protective and electric conductivity power of the wire rod. The gold-plating procedure 2 includes the steps of:

(21) degreasing: where the prepared wire rod is washed in an alkaline solution to remove grease;

(22) primary rinsing: where the degreased wire rod is rinsed with compressed spray of clean water;

(23) acid active: where the primarily rinsed degreased wire rod is dipped in an acid solution to receive an acid active treatment;

(24) secondary rinsing: where the wire rod is rinsed with compressed spray of clean water again;

(25) electroplating: where the wire rod is electroplated with a layer of pure gold;

(26) gold coating formation: where a layer of pure gold of thickness within about 10~100 μin is formed on the surface of the wire rod;

(27) post-rinsing: where the gold-plated wire rod is rinsed with compressed spray of clean water again;

(28) surface treatment: where the gold-plated wire rod is polished;

(29) drying: where baking dries the gold-plated wire rod.

The aforesaid wire rod is preferably selected from oxygen free copper, pure silver, or pure palladium, for the advantages of high conductivity and good extendibility. During the aforesaid wire-drawing process, the wire rod is drawn through a drawing die into a thin wire of thickness within about 40~4000 μin subject to actual requirement. After drawing, the finished product must be examined through a series of quality examination procedures including signal conductivity examination, mechanical property examination, wire diameter examination, and material and impurity content analysis. The finished product can be used only after passed the examination procedures.

Figure 3:
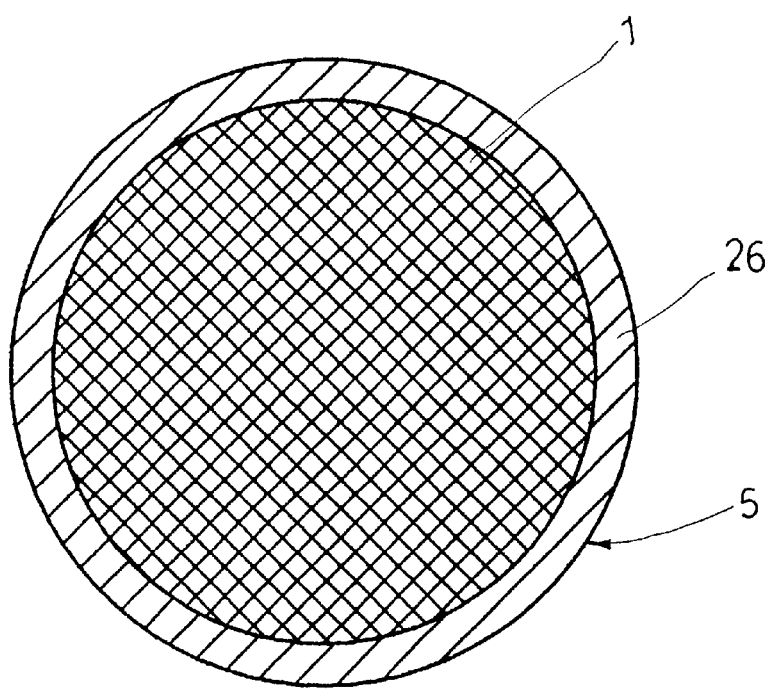
FIG. 3 is a cross-sectional view of a gold wire made according to the present invention.

FIG. 3 is a cross sectional view of a gold wire 5 made according to the present invention. As illustrated, the gold wire 5 has a core member 1 of non-pure gold, and a layer of pure gold coating 26 covering the core member 1. The core member 1 is obtained from oxygen free copper, pure silver, or pure palladium. The area of the core member 1 is about 85% of the gold wire 5. In comparison with the fabrication of conventional pure gold wires, the material cost of the present invention is much lower than the prior art methods.

According to material property tests made at room temperature on φ 25 μm gold wires fabricated subject to the present invention and φ 25 μm pure (99.99%) gold wires fabricated subject to conventional methods, we obtained the following results:

a. Breaking Load Test:

The breaking load test was repeated five times. After tests, the breaking load of the gold wires of the invention is 6~10 g; the breaking load of the pure gold wires of the prior art is 7~12 g.

b. Elongation Test:

100 m gold wires of the invention and 100 m pure gold wires of the prior art were tested five times. After tests, the elongation of the gold wires of the invention is 0.87~1.41%; the elongation of the pure gold wires of the prior art is 2.2~4.9%.

c. Wire Bond Test:

The wire bond test was repeated three times. After tests, the average wire bond of the gold wires of the present invention is 8.33 g; the average wire bond of the pure gold wires of the prior art is 8.33 g.

d. Resistance Test:

The resistance test was made under the condition of test length: 1 m, and test current 1 μA. After test, the resistance of the gold wires of the present invention is 34.46 Ω/m; the resistance of the pure gold wires of the prior art is 48.93 Ω/m.

What the invention claimed is:

1. A gold wire comprising: a non-gold core member and a layer of gold covering the non-gold core member, wherein the non-gold core member is a silver wire.

2. A gold wire comprising: a non-gold core member and a layer of gold covering the non-gold core member, wherein the non-gold core member is a palladium wire.

* * * * *